United States Patent [19]

Ferrer

[11] Patent Number: 5,729,175
[45] Date of Patent: Mar. 17, 1998

[54] METHOD OF DRIVING A CLASS D AUDIO POWER AMPLIFIER USING NON-OVERLAPPING EDGE DRIVE SIGNALS

[75] Inventor: Enrique Ferrer, Miami, Fla.

[73] Assignee: Motorola Inc., Schaumburg, Ill.

[21] Appl. No.: 638,626

[22] Filed: Apr. 26, 1996

[51] Int. Cl.$^6$ ................................................. H03F 3/38
[52] U.S. Cl. .......................... 330/10; 330/146; 330/251
[58] Field of Search ............................... 330/10, 207 A, 330/251, 146

[56] References Cited

U.S. PATENT DOCUMENTS

| | | | |
|---|---|---|---|
| 4,092,610 | 5/1978 | White et al. | 330/10 X |
| 5,126,684 | 6/1992 | Solomon | 330/10 |
| 5,262,733 | 11/1993 | Nakajima et al. | 333/10 |

OTHER PUBLICATIONS

H. Ballen and M. Declercq, Feb. 1995, 12VΣ–ΔClass–D Amplifier in 5V CMOS Technology, IEEE Custom Integrated Circuits Conference, 559–562.

Primary Examiner—James B. Mullins
Attorney, Agent, or Firm—Frank M. Scutch, III

[57] ABSTRACT

A method of actuating a plurality of power amplifier devices in an Class D audio switching amplifier (100) using non-overlapping edge drive signals for preventing substantially high current spikes during switching transitions. The method includes actuating and deactuating power amplifier devices within a first complementary power switching device (117) and actuating and deactuating a second complementary power switching device (119) using a plurality of drive signals generated by a non-overlapping driver (107). The method provides that the first complementary power switching device (117) and the second complementary power switching device (119) are switched ON and OFF in a predetermined sequence such that more than one power amplifier device within each complementary power switching pair is prevented from being simultaneously activated. This prevents high current spiking and subsequently high current drain during a switching transition for conserving battery life when used with portable equipment.

6 Claims, 2 Drawing Sheets

METHOD OF DRIVING A CLASS D AUDIO POWER AMPLIFIER USING NON-OVERLAPPING EDGE DRIVE SIGNALS

TECHNICAL FIELD

This invention relates in general to electrical current drain and more specifically electrical current reduction in a class D audio power amplifier.

BACKGROUND

Many types of electronic audio amplifiers are used today for commercial public address systems, automobile stereo systems as well as portable battery operated products including two-way radios. These audio amplifiers have varying power requirements and amplification characteristics. One general type of audio amplifier is a Class D amplifier which exhibits a high efficiency and is commonly used with pulse width modulated (PWM) drivers.

Pulse width modulation (PWM), sometimes referred to as pulse duration modulation, is a signal processing technique in which a sample value of an input information signal is represented by some property of a resultant pulse other than an amplitude value. When PWM is used, the samples of a message are used to vary the duration of the individual pulses. Thus with PWM, input information is encoded into the time parameter instead of amplitude. The modulating input wave may vary the time of occurrence of the leading edge, trailing edge or both edges of the resultant pulse train.

As is well known in the art, a class D audio power amplifier typically uses a complementary metal oxide semiconductor (CMOS) inverter whose logic state is switched depending on the PWM pulse. When the logic state of the CMOS inverter is switched, there is a short time period during the switching transition in which both complementary devices, forming a complementary pair, conduct at the same time. During this time interval, a current inrush or spike flows through the complementary pair from supply to ground. In the case of a small size inverter, the magnitude of this current spike is not significant.

However, when the power devices in the complementary pair are large, i.e. high power devices capable of handling a high current, the magnitude of the current spike during a switching transition can be substantial. When these MOSFET devices are switched at a high frequency, like in the case of a class D audio power amplifier, the resulting average current drain could be several milliamps which can be unacceptable for a portable device.

Many commercially available Class D audio switching PA's are used in applications such as 50 watts output power automobile sound systems and 500 watt public address systems for hospitals and airports. For these applications, saving a few extra milliamps resulting from the switching overlap of the complementary MOSFET devices may not be as attractive since current drain will not be an issue as in portable battery operated devices.

Thus, the need exists to provide a method of efficiently driving a Class D audio power amplifier for use in portable devices such that no high current spike will be produced during switching transitions.

DETAILED DESCRIPTION OF THE PREFERRED EMBODIMENT

Figure 1:
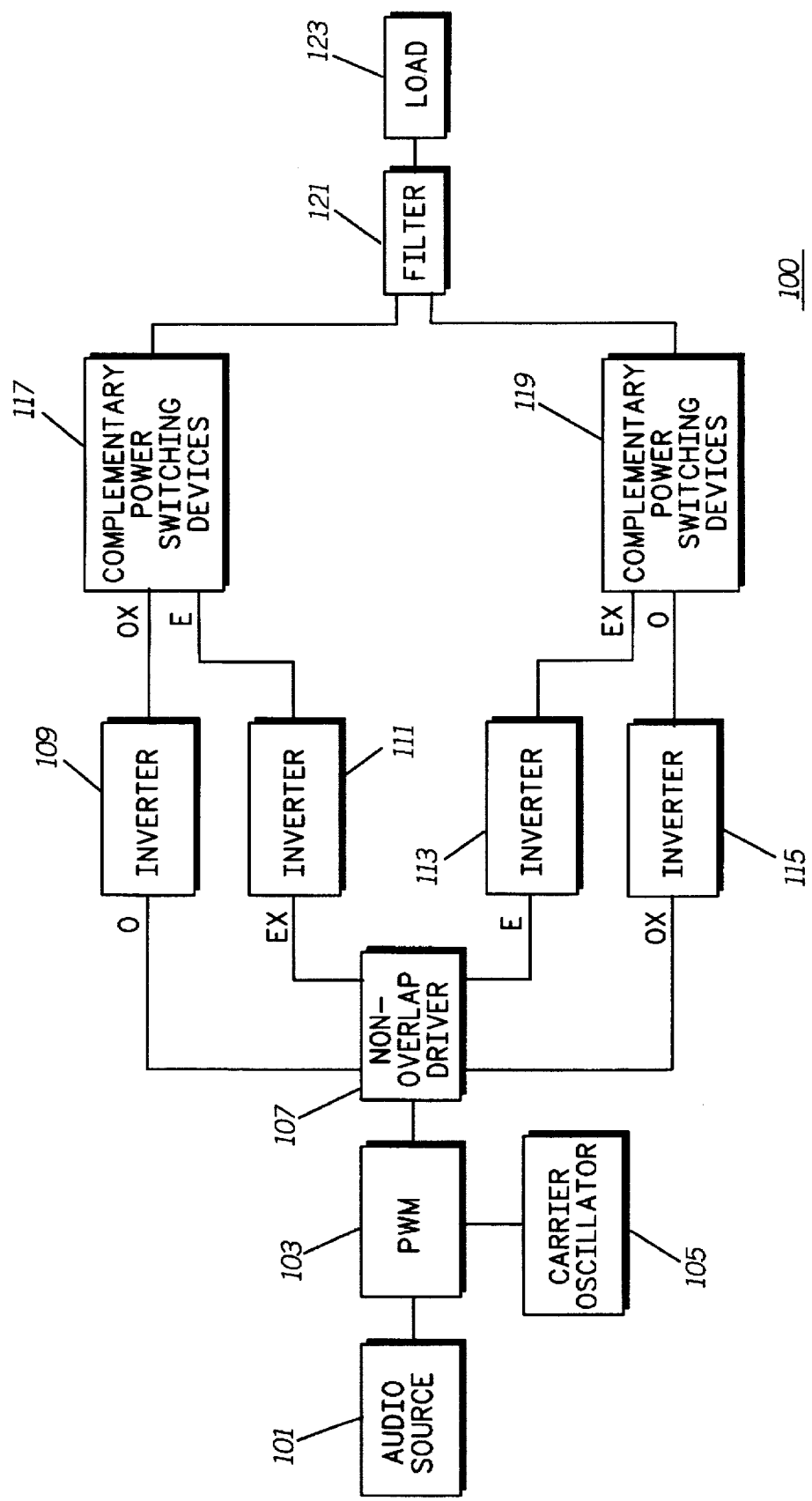
FIG. 1 is a block diagram showing the implementation of the non-overlapping driver with a class D audio switching amplifier according to the preferred embodiment of the invention.

Referring now to FIG. 1, a block diagram of a class D audio amplifier 100 using the non-overlapping driver 107 is used to control a plurality of power amplifier switching devices. As discussed in detail below, the non-overlapping driver 107 is referred to as "non-overlapping" due to it's use of selective drive signals produced therefrom. These signals are switched between HIGH and LOW states for predetermined durations in order to insure that the switching devices, in each complementary pair, that are controlled by the drive signals, are not simultaneously activated.

The non-overlapping driver 107 is controlled using audio signals from an audio source 101 and carrier signals produced by a carrier oscillator 105. The audio signal and carrier signal are each supplied to the pulse width modulator 103. The pulse width modulator 103 produces a series of pulses varying in width or duration but having a constant amplitude and frequency. These pulses conform with the analog audio produced at the audio source 101. Pulse width modulation techniques per se are well known in the art and the details of these techniques will not be discussed herein.

At the output of the non-overlapping driver 107, four independent driver signals are produced refered to as O, OX, E and EX respectively wherein signal OX is the inverse of signal O and signal EX is the inverse of signal E.

Figure 2:
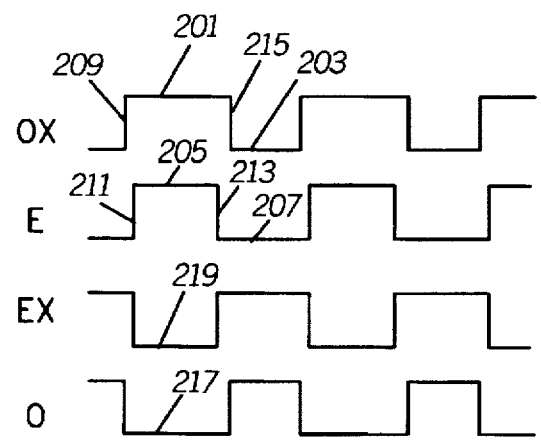
FIG. 2 is a timing diagram showing the various output signals from the non-overlapping driver.

As best seen in FIGS. 1 and 2, these signals are used and applied to a plurality of inverters 109, 111, 113, 115. Inverters 109, 111, 113, and 115 represent separate inverter circuits that utilize respective drive signals applied to the inverter from the non-overlapping driver 107. At the output of inverters 109, 111, 113 and 115, the inverted drive signals of O, OX, E and EX are applied to respective groups of power switching devices 117 and power switching devices 119. Both power switching devices 117 and 119 represent two or more complementary pairs of power semiconductor devices used to provide a high output power audio signal. The drive signals O, OX and E and EX are used to selectively switch the power switching devices 117, 119 into an ON or conducting state so that audio from the pulse width modulator 103 may be delivered to a load or speaker.

As is well known in the art, the power semiconductor devices may include either bipolar devices such as high power switching transistors or high power unipolar devices such as metal oxide semiconductor field effect transistors (MOSFETs). At the output of the complementary power switching device 117 and the complementary power switching device 119, the amplified audio output is presented to a low pass filter 121 which helps to filter out high frequency signal components so the audio signal can be recovered. This filtered signal is then terminated at a load 123 such as transducer or speaker for audible detection by the user.

As seen in FIG. 2, the drive signals O/OX and E/EX are complementary pairs of substantially square wave pulses each having a complementary HIGH and LOW logic state but having the same frequency and amplitude. Thus, drive signal OX has a HIGH state at 201 and a LOW state at 203. Drive signal E has a HIGH state at 205 and a LOW state at 207. It should also be noted that the leading edge 209 of drive signal OX occurs before the leading edge 211 of drive signal E. The trailing edge 213 of drive signal E occurs before the trailing edge 215 of drive signal OX. Therefore, the duration of the HIGH state at 201 on drive signal OX is greater than that of the HIGH state 205 on drive signal E while the duration of the LOW state 207 of drive signal E is greater than that of the LOW state 203 of drive signal OX. In other words, the HIGH state 205 of drive signal E occurs within the time period in which the HIGH state 201 of the drive signal OX occurs. Similarly, the LOW state 203 of drive signal OX occurs within the time period in which the LOW state 207 of drive signal E occurs.

With regard to drive signals EX and O, the HIGH and LOW states of drive signal EX are the complement of E and HIGH and LOW states of drive signal O is the complement of OX. Thus, the HIGH state 201 of drive signal OX is the LOW state 217 of drive signal O. The HIGH state 205 of drive signal E is the LOW state 219 of drive signal EX. The use of drive signal OX, E, EX and O allow for a semiconductor device in a Class D audio power amplifier, using one of these respective drive signals, to be deactuated before it's complementary device is actuated. This prevents both devices, within a complementary pair, to be actuated at the same time.

Figure 3:
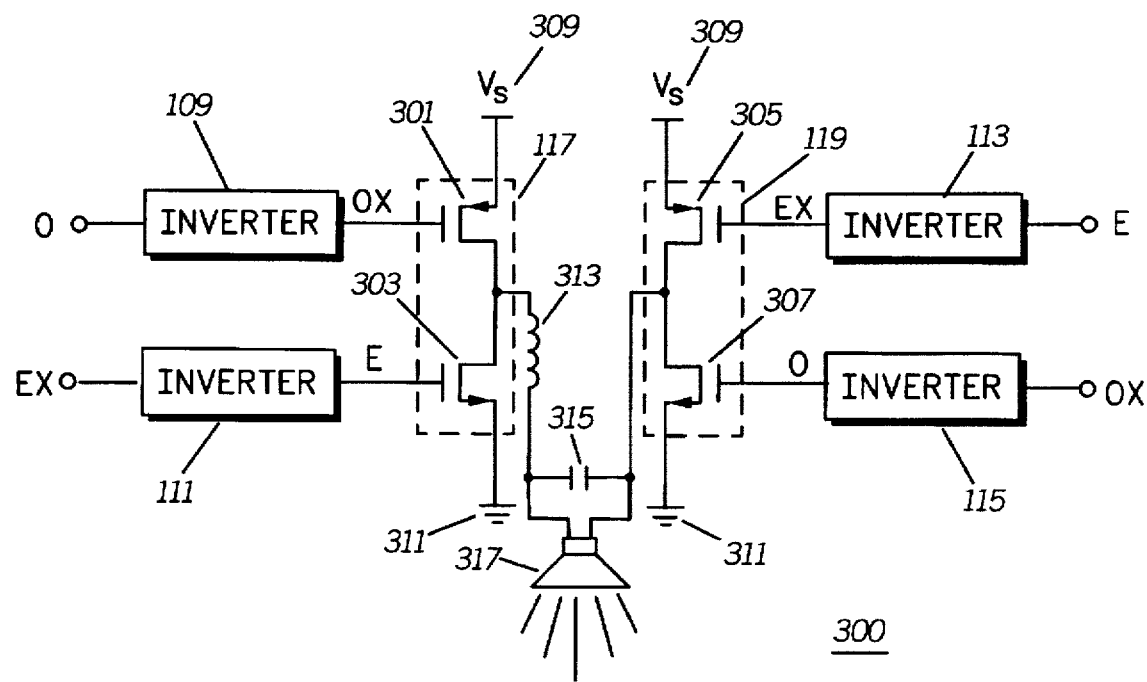
FIG. 3 is a block diagram showing a typical class D audio switching amplifier for use in accordance with the preferred method of the invention.

As seen in FIG. 3, a typical class D audio power amplifier circuit 300 includes a plurality of inverter stages 109, 111, 113, 115 used with a plurality of switching devices such as MOSFET semiconductors 301, 303, 305 and 307. The inverter stages 109, 111, 113 and 115 act as buffers to drive the gate of each switching device to prevent loading of the non-overlap driver circuit (not shown) by each of the switching device's parasitic capacitance. The MOSFET semiconductors are high power devices such as those manufactured by Motorola, Inc. having part number MMDF2C02. The MOSFET 303 and 307 are N-channel devices while MOSFET 301 and 305 are P-channel devices. The low pass filter, comprised of inductor 313 and capacitor 315, is used to filter undesired components from the output signal at each complementary pair before it is supplied to a transducer or speaker 317.

During operation, the drive signal OX and E are used to drive the complementary pair of MOSFETs 301 and 303 while the drive signals EX and O are used to drive the complementary pair of MOSFETs 305, 307. Each of these drive signals, in addition to inverters 109, 111, 113, 115, are used to switch the appropriate MOSFET into it's appropriate state. The non-overlapping driver 107 produces these signals such that MOSFETs 301 and 303 are never switched into an ON state simultaneously. Similarly, MOSFETs 305 and 307 are selectively switched so they are also never in an ON state simultaneously. Thus, the idling current resulting at a switching transition of complementary output power devices is eliminated. This allows minimal current to be used during the ON/OFF switching transition, preventing any current spikes flowing, through either complementary pairs 117, 119, from the voltage supply 309 to ground 311.

For example using the complementary power switching device 117, and drive signal O and EX, these drive signals are passed through inverters 109 and 111 respectively producing a complementary signals. These complementary drive signals are used to switch MOSFET 301 and 303 respectively such that MOSFET 301 is first switched to an OFF state. Then MOSFET 303 is switched to an ON state. Then MOSFET 303 is switched to an OFF state before MOSFET 301 is switched to an ON state. This prevents both MOSFETs 301 and 303 from being simultaneously in an ON state during a switching transition preventing a current spike from the voltage supply 309 to ground 311.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of actuating a plurality of complementary power devices in an audio switching amplifier for preventing current spikes comprising the steps of:

actuating and deactuating at least one power device in a first complementary amplifier pair used for amplifying an audio signal;

actuating and deactuating at least one power device in a second complementary amplifier pair used for amplifying an audio signal; and wherein the at least one power device in the first complementary pair and the at least one power device in the second complementary pair are actuated and deactuated in a predetermined sequence using a plurality of logic state transposing inverters for preventing more than one power device within the first complementary pair and the second complementary pair from being simultaneously actuated during a switching transition to reduce current spikes through either complementary pair.

2. A method of actuating a plurality of complementary amplifier pairs as in claim 1 wherein the at least one power device in the first complementary pair and the at least one power device in the second complementary pair are actuated and deactuated using substantially square wave pulses.

3. A method of driving a plurality of amplifier sections in a switching audio amplifier comprising the steps of:

switching a first transistor in a first complementary pair between an ON and OFF state using a first drive signal;

switching a second transistor in the first complementary pair between an ON and OFF state using a second drive signal;

switching a third transistor in a second complementary pair between and ON and OFF state using a third drive signal;

switching a fourth transistor in the second complementary pair between an ON and OFF state using a fourth drive signal;

a logic state transposing inverter stage associated with each respective first, second, third and fourth drive signal for buffering to prevent loading of a driver circuit by a parasitic capacitance of each respective first, second, third and fourth transistor; and wherein during a switching transition between the first transistor and the second transistor, the first transistor is switched to an OFF state before the second transistor is switched to an ON state and further wherein during a switching transition between the third transistor and the fourth transistor, the third transistor is switched to an OFF state before the fourth transistor is switched to an ON state.

4. A method of driving a plurality of amplifiers as in claim 3 wherein the first transistor, second transistor, third transistor and fourth transistor are activated using a plurality of respective substantially square wave pulses.

5. A method of driving a Class D audio switching amplifier using a plurality of non-overlapping edge drive signals for preventing semiconductor devices in at least one complementary pair from simultaneously conducting comprising the steps of:

providing a first drive signal for actuating a first device in a first complementary pair;

providing a second drive signal for actuating a second device in the first complementary pair;

providing a third drive signal for actuating a third device in a second complementary pair;

providing a fourth drive signal for actuating a fourth device in the second complementary pair;

a logic state transposing inverter stage associated with each respective first, second, third and fourth drive signal for buffering to prevent loading of a driver circuit by a parasitic capacitance of each respective first complementary pair and second complementary pair; and wherein the first complementary pair and second complementary pair are actuated and deactuated in a predetermined sequence such that the first device and second device are not simultaneously actuated during a switching transition and the third device and the fourth device are not simultaneously actuated during a switching transition for preventing a high current condition through either the first complementary pair or the second complementary pair.

6. A method as in claim 5 wherein the first drive signal, second drive signal, third drive signal and fourth drive signal are substantially square wave pulses.

* * * * *